(12) United States Patent
Tanaka et al.

(10) Patent No.: US 7,362,172 B2
(45) Date of Patent: Apr. 22, 2008

(54) VARIABLE GAIN CIRCUIT

(75) Inventors: Takatoshi Tanaka, Hyogo (JP); Takuo Hino, Osaka (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 10/587,167

(22) PCT Filed: Jan. 27, 2005

(86) PCT No.: PCT/JP2005/001129

§ 371 (c)(1),
(2), (4) Date: Jul. 26, 2006

(87) PCT Pub. No.: WO2005/074128

PCT Pub. Date: Aug. 11, 2005

(65) Prior Publication Data

US 2007/0170991 A1    Jul. 26, 2007

(30) Foreign Application Priority Data

Jan. 30, 2004    (JP) ............................. 2004-023658

(51) Int. Cl.
*H03G 3/20* (2006.01)
(52) U.S. Cl. .................. 330/129; 330/124 R; 330/310
(58) Field of Classification Search ................ 330/129, 330/124 R, 310, 207 A
See application file for complete search history.

(56) References Cited

U.S. PATENT DOCUMENTS 6,417,737 B1 * 7/2002 Moloudi et al. ............. 330/301
6,958,649 B2 * 10/2005 Nagamori et al. ........... 330/133
7,098,737 B2 * 8/2006 Fujimoto et al. ............ 330/283
7,102,444 B2 * 9/2006 Shanjani et al. ............. 330/295

(Continued)

FOREIGN PATENT DOCUMENTS

EP    1049249    11/2000

(Continued)

OTHER PUBLICATIONS

PCT International Search Report dated May 31, 2005.

(Continued)

*Primary Examiner*—Patricia Nguyen
(74) *Attorney, Agent, or Firm*—Stevens, Davis, Miller & Mosher, LLP

(57) ABSTRACT

Low distortion is implemented even in a high input level, and a smooth change in gain is maintained. A first amplifier (10) with high gain and low noise that can be gain-controlled by a first gain control signal, and a second amplifier (20) with low gain and low distortion that can be gain-controlled by a second gain control signal are provided, and a third amplifier (30) is further coupled with an outputs of the first and the second amplifiers (10, 20). An input terminal of the first amplifier (10) and an input terminal of the second amplifier (20) are coupled with each other, and an output terminal of the first amplifier (10) and an output terminal of the second amplifier (20) are coupled with each other. The output of the first amplifier (10) is then turned on or off by a mode switching signal. A change in gain resulting from turning on and off the first amplifier (10) is corrected by the third amplifier (30).

20 Claims, 17 Drawing Sheets

U.S. PATENT DOCUMENTS 7,250,814 B2 * 7/2007 Bardsley et al. .............. 330/51

FOREIGN PATENT DOCUMENTS

| JP | 0 9321637 | 12/1997 |
| JP | 2000 323947 | 11/2000 |
| JP | 2002 510888 | 4/2002 |
| WO | 9950956 | 10/1999 |

OTHER PUBLICATIONS

Japanese Office Action dated May 2, 2006 with English translation.

* cited by examiner

GAIN CONTROL VOLTAGE    Vgca3 [V]

VARIABLE GAIN CIRCUIT

BACKGROUND OF THE INVENTION

1. Field of the Invention

The present invention relates to a variable gain circuit used for a wireless communication apparatus including a mobile terminal.

2. Description of Related Art

A prior art of a variable gain circuit is shown in FIG. 23. This variable gain circuit is provided with a first amplifier 10 of voltage input current output type having high gain and low noise characteristics, and a second amplifier 20 of voltage input current output type having low gain and low distortion characteristics. A gain of the first amplifier 10 is controlled by a first gain control signal 11. Meanwhile, a gain of the second amplifier 20 is controlled by a second gain control signal 21.

The first and the second amplifiers 10 and 20 are connected in parallel with each other. More specifically, an input of the first amplifier 10 and an input of the second amplifier 20 are coupled with each other. A voltage input signal is thereby supplied in common to the first and the second amplifiers 10 and 20. An output of the first amplifier 10 and an output of the second amplifier 20 are also coupled with each other. Thereby, a current output signal of the first amplifier 10 and a current output signal of the second amplifier 20 are additionally combined.

A more specific configuration of the first and the second amplifiers 10 and 20 in FIG. 23 will be shown in FIG. 24. As shown in FIG. 24, the first amplifier 10 is composed of a fixed gain amplifier 10a of voltage input current output type having high gain and low noise characteristics, and a shunt circuit 10b for shunting an output current of the fixed gain amplifier 10a to two current output terminals 10c and 10d at a shunt ratio according to the first gain control signal 11. Meanwhile, the second amplifier 20 is composed of a fixed gain amplifier 20a of voltage input current output type having low gain and low distortion characteristics, and a shunt circuit 20b for shunting an output current of the fixed gain amplifier 20a to two current output terminals 20c and 20d at a shunt ratio according to the second gain control signal 21.

Here, an input terminal of the first fixed gain amplifier 10a and an input terminal of the second fixed gain amplifier 20a form input terminals of the first and the second amplifiers 10 and 20, respectively, and one current output terminals 10c of the first shunt circuit 10b and one the current output terminal 20c of the second shunt circuit 20b form output terminals of the first and the second amplifiers 10 and 20, respectively.

For example, irrespective of a level change of an input signal, this variable gain circuit controls the gains of the first and the second amplifiers 10 and 20 using the first and the second gain control signals 11 and 21 so that an output signal level thereof may become constant. Specifically, when the level of the input signal is low, a combined gain of the first and the second amplifiers 10 and 20 is increased, whereas when the level of the input signal is high, the combined gain of the first and the second amplifiers 10 and 20 is decreased, so that the output signal level is kept constant.

As described above, in order to change the combined gain of the first and the second amplifiers 10 and 20 according to the level of the input signal, it is required to change respective gain contribution factors of the first and the second amplifiers 10 and 20 by the first and the second gain control signals 11 and 21.

When the first and the second amplifiers 10 and 20 are composed like FIG. 24, it is possible to change the respective gain contribution factors of the first and the second amplifiers 10 and 20 to the output of the variable gain circuit by changing the shunt ratio between the shunt circuits 10b and 20b. In other words, when the current fed through the current output terminal 10c for the first amplifier 10 is increased and the current fed through the current output terminal 20c for the second amplifier 20 is decreased, the gain contribution factor of the first amplifier 10 will be increased, and the gain contribution factor of the second amplifier 20 will be decreased. On the contrary, when the current fed through the current output terminal 10c for the first amplifier 10 is decreased and the current fed through the current output terminal 20c for the second amplifier 20 is increased, the gain contribution factor of the first amplifier 10 will be decreased, and the gain contribution factor of the second amplifier 20 will be increased.

As described above, when the variable gain circuit is composed so that the gain thereof may be smoothly changed from a low gain to a high gain by changing the respective gain contribution factors of the first and the second amplifiers 10 and 20 by the first and the second gain control signals 11 and 21, the variable gain circuit with wide dynamic range, which has low noise characteristics at the high gain, and has low distortion characteristics at the low gain can be achieved.

A still more concrete example of a circuit configuration of the variable gain circuit shown in FIG. 23 is shown in FIG. 25. This variable gain circuit has a differential pair 1 and a differential pair 2.

The differential pair 1 composes an amplifier with high gain and low noise. A transistor Q1 and a transistor Q2 are coupled at emitters with each other via a resistor R1, and current sources 111 and 112 are connected to respective emitters.

The differential pair 2 composes an amplifier with low gain and low distortion. A transistor Q3 and a transistor Q4 are coupled at emitters with each other via a resistor R2, and current sources 121 and 122 are connected to respective emitters.

The differential pairs 1 and 2 are then coupled at input terminals with each other. Specifically, a base of the transistor Q1 and a base of the transistor Q3 are coupled with each other, resulting in a differential input Vin1. Meanwhile, a base of the transistor Q2 and a base of the transistor Q4 are coupled with each other, resulting in a differential input Vin2.

Moreover, output terminals of the differential pairs 1 and 2 are coupled with each other. Specifically, emitters of transistors Q5 and Q6 are connected to each other and are connected to a collector of the transistor Q3. Emitters of transistors Q7 and Q8 are coupled with each other and are connected to a collector of the transistor Q1. Emitters of transistors Q9 and Q10 are coupled with each other and are connected to a collector of the transistor Q2. Emitters of transistors Q11 and Q12 are coupled with each other and are connected to a collector of the transistor Q4. Collectors of the transistors Q6 and Q7 are coupled with each other. Collectors of the transistors Q10 and Q11 are coupled with each other. Collector of the transistors Q5, Q8, Q9, and Q12 are connected to a power supply Vcc via resistors, respectively.

In the foregoing configuration, as the output of the variable gain circuit, a collector current Iout1 is derived from a node between the collectors of the transistors Q6 and Q7, and a collector current Iout2 is derived from a node between the collectors of the transistors Q10 and Q11.

Additionally, bases of the transistors Q7 and Q10 are coupled with a positive electrode of a first gain control voltage (gain control signal) Vgca1, and bases of the transistors Q8 and Q9 are coupled with a negative electrode of the first gain control voltage Vgca1. Meanwhile, bases of the transistors Q6 and Q11 are coupled with a positive electrode of a second gain control voltage (gain control signal) Vgca2, and bases of the transistors Q5 and Q12 are coupled with a negative electrode of the second gain control voltage Vgca2.

Next, a gain control method in this variable gain circuit will be described. A collector current of the transistor Q1 shunts to the transistor Q7 and the transistor Q8 according to the gain control voltage Vgca1. For that reason, the transistor Q7 and the transistor Q8 form a linearity current shunt circuit controllable by the gain control voltage Vgca1. Similarly, a collector current of the transistor Q2 shunts to the transistor Q9 and the transistor Q10 by the gain control voltage Vgca1. For that reason, the transistor Q9 and the transistor Q10 form a linearity current shunt circuit controllable according to the gain control voltage Vgca1.

Hence, a current ratio between a pair of the collector currents of the transistor Q7 and the transistor Q10 whose bases are coupled with a positive electrode side of the gain control voltage Vgca1, and a pair of the collector currents of the transistor Q8 and the transistor Q9 whose bases are coupled with a negative electrode side thereof can be controlled according to the gain control voltage Vgca1.

Meanwhile, a collector current of the transistor Q3 shunts to the transistor Q5 and the transistor Q6 according to the gain control voltage Vgca2. For that reason, the transistor Q5 and the transistor Q6 form a linearity current shunt circuit controllable by the gain control voltage Vgca2. Similarly, a collector current of the transistor Q4 shunts to the transistor Q11 and the transistor Q12 according to the gain control voltage Vgca2. For that reason, the transistor Q11 and the transistor Q12 form a linearity current shunt circuit controllable by the gain control voltage Vgca2.

Hence, a current ratio between a pair of the collector currents of the transistor Q6 and the transistor Q11 whose bases are coupled with a positive electrode side of the gain control voltage Vgca2, and a pair of the collector currents of the transistor Q5 and the transistor Q12 whose bases are coupled with a negative electrode side thereof can be controlled according to the gain control voltage Vgca2.

Assuming that a sum of the collector currents derived by coupling respective collectors of the transistors Q6 and Q7 with each other is Iout1, and a sum of the collector currents derived by coupling respective collectors of the transistors Q10 and Q11 with each other is Iout2, it is understood that the current Iout1 and the current Iout2 results in a differential current from the aforementioned description.

The currents flowing through the transistors Q1 and Q2 are then shunted by the transistors Q7, Q8, Q9, and Q10 by changing the gain control voltage Vgca1 as follows, and the currents flowing through the transistors Q3 and Q4 are shunted by the transistors Q5, Q6, Q11, and Q12 by changing the gain control voltage Vgca2 as follows.

In other words, in order to prevent degradation of a noise figure (Noise Figure) in a low input level, the currents flowing through the transistors Q1, Q2, Q3, and Q4 are shunted so that the collector current of the differential pair 1 composing the amplifier with high gain and low noise may be a main current of the output currents Iout1 and Iout2. Additionally, in order to prevent generation of the distortion in a high input level, the currents flowing through the transistors Q1, Q2, Q3, and Q4 are shunted so that the collector current of the differential pair 2 composing the amplifier with low gain and low distortion may be the main current of the output currents Iout1 and Iout2. When the shunted currents are then summed to derive the output currents Iout1 and Iout2, a total gain of the variable gain circuit can be changed smoothly by adjusting the shunt ratio.
[Patent Document 1] Domestic Announcement No. 2002-510888

DISCLOSURE OF INVENTION

Problems to be Solved by the Invention

However, in the variable gain circuit according to the prior art, the total gain is changed smoothly. For that reason, in a certain high input level, the gain from the amplifier 20 with low gain and low distortion and the small gain of the amplifier 10 with high gain and low noise may be summed. As a result, a distortion component of the output of the amplifier 10 with high gain and low noise, which has a narrow dynamic range will be mixed into the output of the variable gain circuit. Since the gain of the amplifier 10 with high gain and low noise approaches zero when the input level is increased, the distortion component is reduced.

In short, there has been a problem that the distortion component of the variable gain circuit has been increased in a certain high input level. This point will be specifically described using FIG. 25. Since the collector currents of the transistors Q7 and Q10 are not cut off thoroughly, nonlinearity of the transistors Q1 and Q2 will appear on the output of the variable gain circuit via the transistors Q7 and Q10 in a form of the distortion component.

Therefore, an object of the present invention is to provide a variable gain circuit, in which distortion is reduced in a high input level, and characteristics with near-linearity across a wide dynamic range from a very low input level to a high input level can be provided.

Means to Solve the Problems

In order to solve the aforementioned problems, according to the present invention, in a variable gain circuit comprising an amplifier with high gain and an amplifier with low gain, which are connected in a parallel and gain-controlled, there is employed a configuration in which a distortion component is thoroughly cut off by turning off an output of the amplifier with high gain in a high input level. Thereby, distortion is reduced in a high input level, thus making it possible to obtain characteristics with near-linearity across a wide dynamic range from a very low input level to a high input level.

Moreover, there may be employed a configuration having a function of correcting, by an amplifier in the next stage, a reduction in gain resulting from an output of the amplifier with high gain being turned off. As a result of this, the gain can be smoothly changed.

In addition to the aforementioned solving means, there may be provided a circuit for implementing an active state for allowing the amplifier with high gain to be turned off, and a sleep state for prohibiting it to be turned off. The aforementioned active state means a state where the amplifier with high gain is turned off in a high input level. Meanwhile, the sleep state means a state where the amplifier with high gain is not turned off even in a high input level.

Hereafter, description will be made in detail.

A variable gain circuit according to the present invention includes a first amplifier with high gain having a first amplifier input and a first amplifier output, and being gain-controlled by a first gain control signal, and a second amplifier with low gain having a second amplifier input and a second amplifier output, and being gain-controlled by a second gain control signal. An input signal is then supplied in common to the first and the second amplifiers by coupling the first amplifier input and the second amplifier input with each other, and the output signal of the first amplifier and the output signal of the second amplifier are additionally combined by coupling the first amplifier output and the second amplifier output with each other. Further, the first amplifier has a function to turn on and off the output in response to a mode switching signal.

According to the present invention, the output of the first amplifier among the first amplifier with high gain and the second amplifier with low gain, which are connected in parallel, can be turned on and off by the mode switching signal. For that reason, by turning off the output of the first amplifier in a high input level, distortion is reduced in a high input level, thus making it possible to obtain characteristics with near-linearity across a wide dynamic range from a very low input level to a high input level.

In the configuration of the variable gain circuit according to the aforementioned present invention, the first amplifier is comprising, for example, a first fixed gain amplifier of voltage input current output type, and a first shunt circuit for shunting an output current of the first fixed gain amplifier to two current output terminals at a shunt ratio according to the first gain control signal, Additionally, the second amplifier is comprising, for example, a second fixed gain amplifier of voltage input current output type, and a second shunt circuit for shunting an output current of the second fixed gain amplifier to two current output terminals at a shunt ratio according to the second gain control signal.

According to this configuration, an input terminal of the first fixed gain amplifier and an input terminal of the second fixed gain amplifier form the first amplifier input and the second amplifier input, respectively. Moreover, either of the current output terminals of the first shunt circuit and either of the current output terminals of the second shunt circuit form the first amplifier output and the second amplifier output, respectively.

In the variable gain circuit of the aforementioned present invention, preferably, direction of a gain change of the first amplifier with respect to a change of the first gain control signal and direction of a gain change of the second amplifier with respect to a change of the second gain control signal are set in reverse to each other, the first gain control signal and the second gain control signal are in common use.

Moreover, in the variable gain circuit of the aforementioned present invention, preferably, the first amplifier input and the second amplifier input are differential inputs, respectively. In addition, preferably, the first amplifier output and the second amplifier output are differential outputs, respectively.

Moreover, in the variable gain circuit of the aforementioned present invention, preferably, there is further provided with a third amplifier having a third amplifier input and a third amplifier output, and being gain-controlled by a third gain control signal, wherein the third amplifier input is coupled with the first amplifier output and the second amplifier output.

According to this configuration, a gain control range thereof can be further expanded.

As described above, in the configuration provided with the third amplifier, preferably, there is provided a gain correction circuit for correcting an amount of gain change resulting from the output of the first amplifier being cut off, by changing a gain of the third amplifier using the third gain control signal, at the same time when the output of the first amplifier is cut off, wherein an amplitude fluctuation in the output of the third amplifier is prevented by the gain correction circuit.

As a result of this, an amount of gain change resulting from ON/OFF switching of the output of the first amplifier can be corrected using the third amplifier, thus making it possible to prevent an amplitude fluctuation in the output of the third amplifier resulting from ON/OFF switching of the output of the first amplifier.

Meanwhile, in the variable gain circuit of the aforementioned present invention, a gain control signal converting circuit for creating the first gain control signal and the second gain control signal from a fourth gain control signal is preferably provided. Additionally in the variable gain circuit provided with the third amplifier, a gain control signal converting circuit for creating the first gain control signal, the second gain control signal, and the third gain control signal from the fourth gain control signal is preferably provided.

In the aforementioned configuration, preferably, there is provided a gain correction circuit for correcting an amount of gain change caused in conjunction with (for example, simultaneously with) turning off the output of the first amplifier by the mode switching signal, and an amplitude fluctuation in the output of the third amplifier is prevented by shifting the third gain control signal which is an output of the gain control signal converting circuit using this gain correction circuit.

In the aforementioned configuration, a detection circuit for outputting the mode switching signal by comparing the fourth gain control signal with a reference signal is preferably provided.

Additionally, in the aforementioned configuration, a detection circuit for outputting the mode switching signal by comparing the output amplitude of the third amplifier with a reference signal is preferably provided. In this case, the output level of the third amplifier when fixing the gains of the first amplifier, the second amplifier, and the third amplifier by setting the level of the fourth gain control signal constant is compared with the reference signal.

Moreover, in the aforementioned configuration, preferably, at a subsequent stage of the output of the third amplifier, an amplifier or a mixer circuit is connected, and a detection circuit for outputting the mode switching signal by comparing an amplitude of an output signal of the amplifier or the mixer circuit with a reference signal is provided.

Moreover, in the aforementioned configuration, a detection circuit for outputting the mode switching signal by comparing an input amplitude of the first amplifier with a reference signal is preferably provided.

In the aforementioned configuration, preferably, the detection circuit uses a clock signal for detection of the fourth gain control signal, detection of the output amplitude of the third amplifier, detection of the amplitude of the output signal of the amplifier or the mixer circuit, or detection of the input signal of the first amplifier, and provided with a function to perform the detection at every certain timing.

In the configuration according to the aforementioned present invention, the mode switching status circuit for implementing, by a switching enabling signal, an active state of allowing the switching operation for the first amplifier and the control for the gain correction circuit in conjunction with it, and a sleep state of prohibiting them is preferably provided.

Moreover, in the variable gain circuit of the aforementioned present invention, an amplifier or an attenuator having a gain varying function is preferably provided at a preceding stage of the inputs of the first amplifier and the second amplifier. In that case, the gain is preferably changed simultaneously with generation or an output of the mode switching signal. The timing of changing the gain may not be simultaneous with the mode switching signal.

According to this configuration, an amount of gain change resulting from the mode switching can be corrected by the amplifier or the attenuator having the gain varying function, thus making it possible to prevent an output fluctuation.

Advantages of the Invention

According to the present invention, it is possible to implement the variable gain circuit, in which distortion is reduced in a high input level, and characteristics with near-linearity across a wide dynamic range from a very low input level to a high input level can be provided.

NUMERICAL REFERENCES

Figure 1:
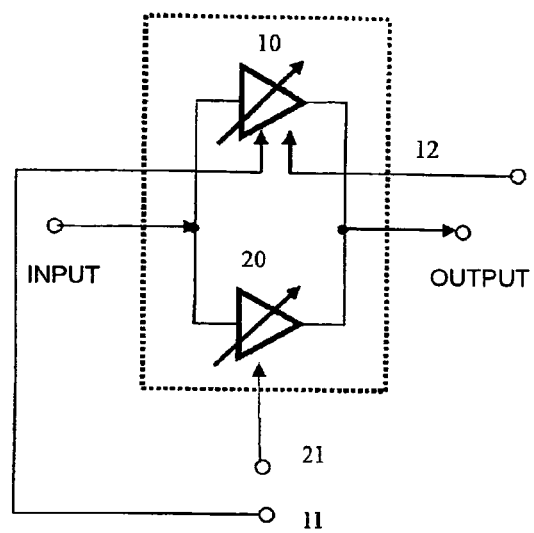
FIG. 1 is a block diagram illustrating a configuration of a variable gain circuit of a first embodiment of the present invention.

10 First amplifier
20 Second amplifier
30 Third amplifier
40 Gain control signal converting circuit
50 Gain correction circuit
60 Detection circuit
80 Amplifier
90 Mixer circuit
100 Mode switching status circuit
200 Variable gain circuit section
300 Variable gain circuit section Best Mode for Carrying Out the Invention Hereinafter, referring to the drawings, embodiments of the present invention will be described.

FIRST EMBODIMENT

A variable gain circuit according to a first embodiment of the present invention is shown in FIG. 1. As shown in FIG. 1, this variable gain circuit is provided with a first amplifier 10 having a first amplifier input and a first amplifier output, and a second amplifier 20 having a second amplifier input and a second amplifier output.

The first amplifier 10 has high gain and low noise characteristics, and is gain-controlled by a first gain control signal 11. The second amplifier 20 has low gain and low distortion characteristics, and is gain-controlled by a second gain control signal 21.

The first amplifier 10 and the second amplifier 20 are then coupled in parallel with each other. More specifically, the first amplifier input of the first amplifier 10 and the second amplifier input of the second amplifier 20 are coupled with each other. A voltage input signal is thereby supplied in common to the first and the second amplifiers 10 and 20. Moreover, the first amplifier output of the first amplifier 10 and the second amplifier output of the second amplifier 20 are coupled with each other. Thereby, a current output signal of the first amplifier 10 and a current output signal of the second amplifier 20 are additionally combined with each other.

Moreover, this variable gain circuit has such a function that a mode switching signal 12 can turn on or off the output of the first amplifier 10.

Figure 23:
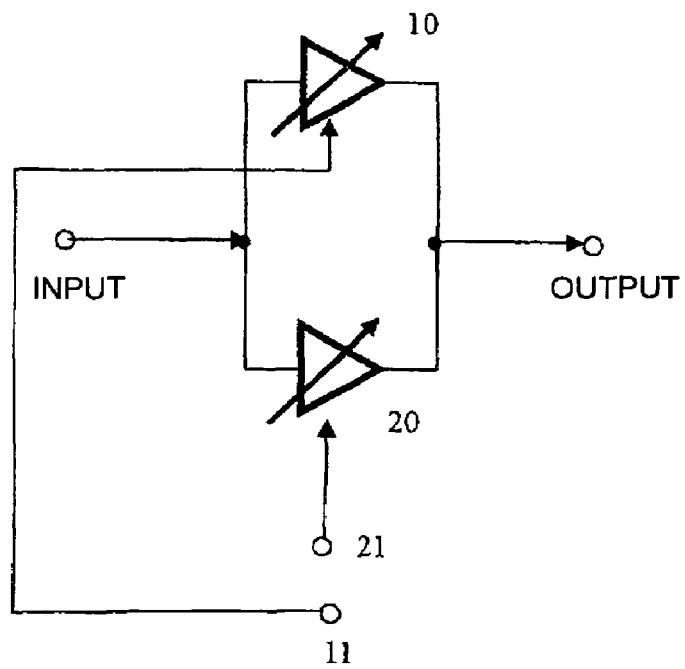
FIG. 23 is a block diagram illustrating a configuration of a prior art of a variable gain circuit.
Figure 24:
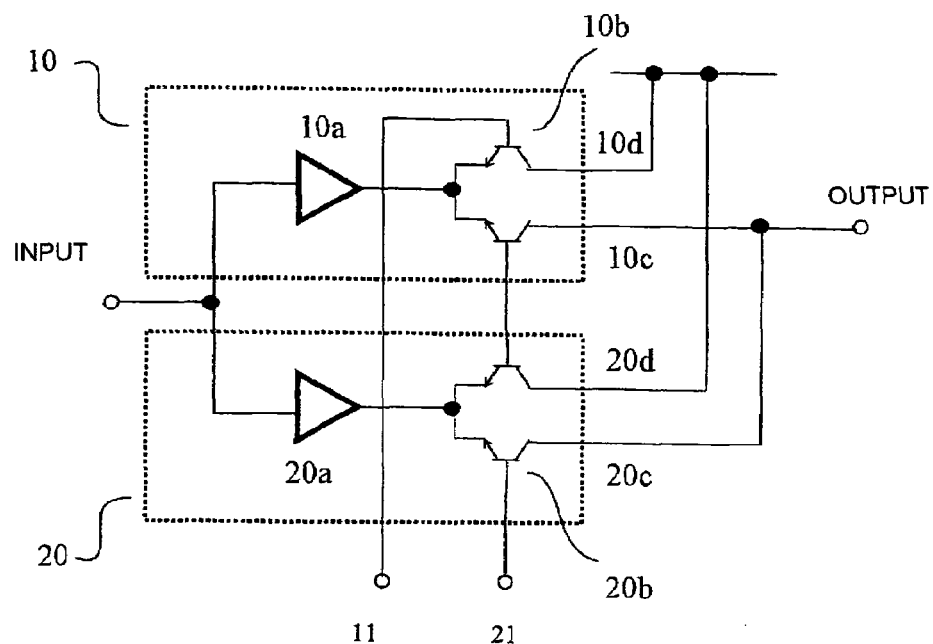
FIG. 24 is a circuit diagram illustrating a specific configuration of the prior art of the variable gain circuit.
Figure 25:
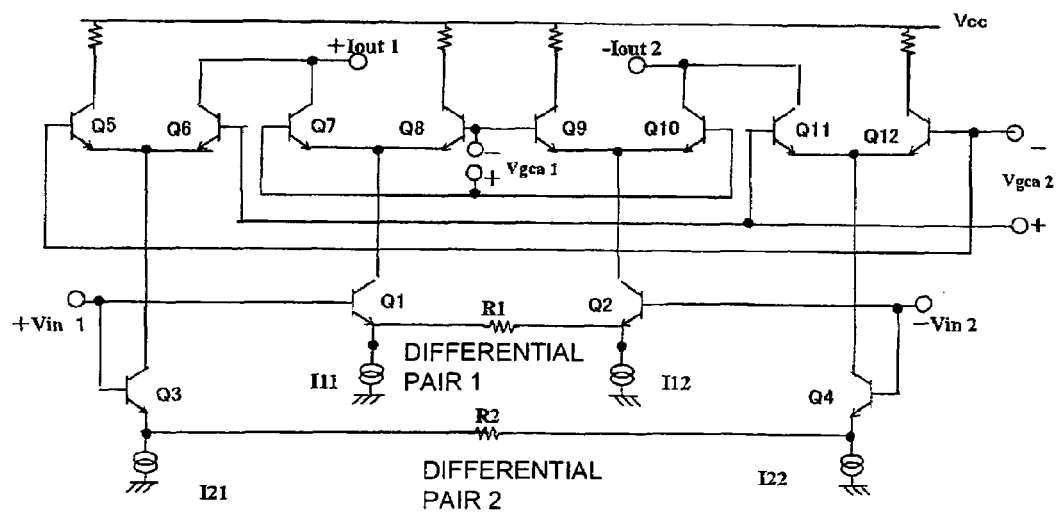
FIG. 25 is a circuit diagram illustrating a specific configuration of the prior art of the variable gain circuit.

Except for the configuration in which the output of the first amplifier 10 is turned on or off by the mode switching signal 12, the configuration is similar to that of the prior art shown in FIG. 23 through FIG. 25.

The variable gain circuit of this embodiment is configured such that the output of the first amplifier 10 among the first amplifier 10 with high gain and low noise and the second amplifier 20 with low gain and low distortion which are provided in parallel can be turned on or off by the mode switching signal 12. For that reason, forcing the first amplifier 10 to turn off in a high input level reduces distortion thereof in a high input level. Hence, according to the variable gain circuit of this embodiment, characteristics with near-linearity across a wide dynamic range from a very low input level to a high input level can be obtained.

Note herein that, while the first gain control signal 11 and the second gain control signal 21 are independently provided in the aforementioned first embodiment, they may be provided in common. In this case, it is required that direction of the gain change of the first amplifier 10 and direction of the gain change of the second amplifier 20 are set in reverse to each other with respect to a change in the gain control signal.

Moreover, in the variable gain circuit according to the aforementioned embodiment, preferably, the first amplifier input and the second amplifier input are differential inputs, respectively, and the first amplifier output and the second amplifier output are also differential outputs, respectively.

SECOND EMBODIMENT

Figure 2:
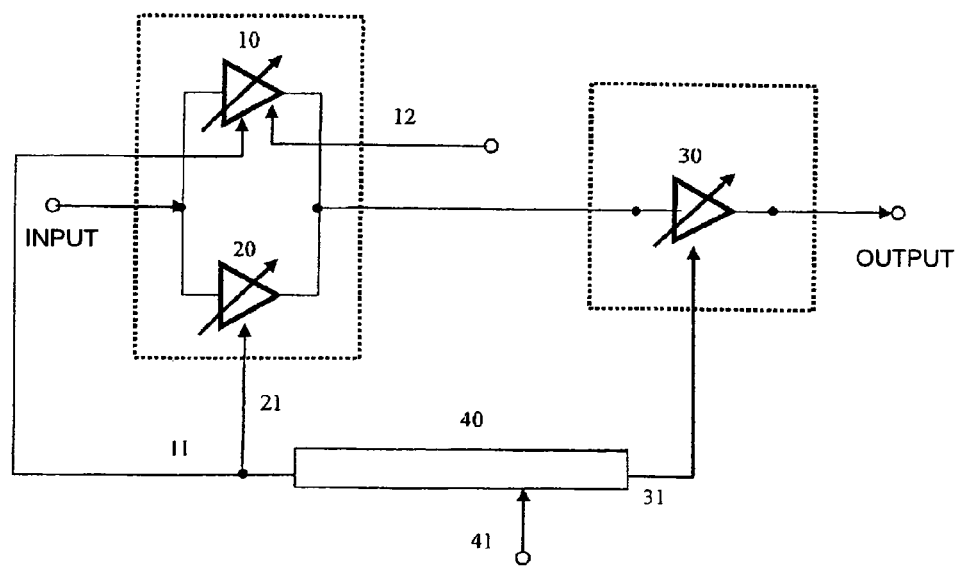
FIG. 2 is a block diagram illustrating a configuration of a variable gain circuit of a second embodiment of the present invention.

A variable gain circuit according to a second embodiment of the present invention is shown in FIG. 2. As shown in FIG. 2, this variable gain circuit is further provided with a third amplifier 30 having a third amplifier input and a third amplifier output, and is gain-controlled by a third gain control signal 31, wherein the third amplifier input is coupled with the first amplifier output and the second amplifier output.

Moreover, in this embodiment, there is provided a gain control signal converting circuit 40 for creating the first gain control signal 11, the second gain control signal 21, and the third gain control signal 31 from the a fourth gain control signal 41. This gain control signal converting circuit 40 is a circuit for expanding or reducing a variable range of at least one of the first, second, and the third gain control signals 11, 21, and 31 from a variable range of the fourth gain control signal 41.

Figure 3:
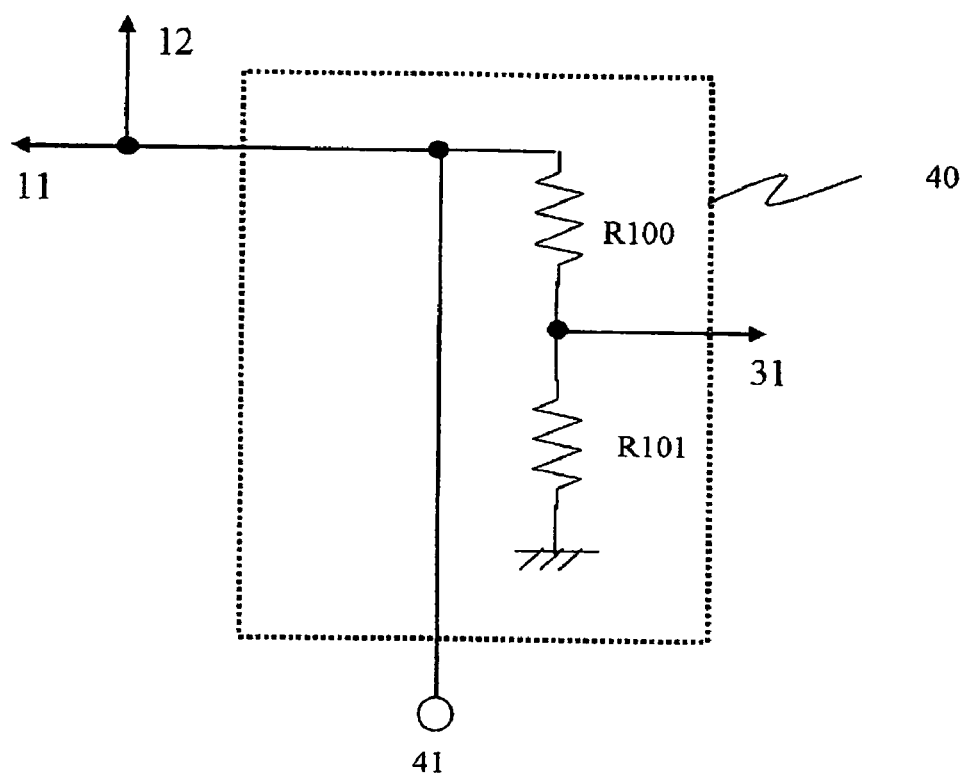
FIG. 3 is a circuit diagram illustrating a specific example of a gain control signal converting circuit.

A specific example of the gain control signal converting circuit 40 is shown in FIG. 3. In the circuit shown in FIG. 3, the fourth gain control signal 41 is outputted as it is as the first gain control signal 11 and the second gain control signal 21. Moreover, a signal obtained by dividing the fourth gain control signal 41 by resistors R100 and R101 is outputted as the third gain control signal 31. Gain control characteristics of the third amplifier 30 due to the gain control signal 41 will thereby be shifted to gain control characteristics of the first and the second amplifiers 10 and 20 due to the gain control signal 41.

Incidentally, supposing that it be applied to the case of the first embodiment, it turned out that the first gain control signal 11 and the second gain control signal 21 are created from the fourth gain control signal 41.

The other configuration is similar to that shown in FIG. 1.

According to this embodiment, since the third amplifier 30 is provided, the gain variable range can be increased. Moreover, if the gain of the third amplifier 30 is changed by the third gain control signal 31 simultaneously with turning off the output of the first amplifier 10, an amount of gain change caused by turning off the output of the first amplifier 10 can be corrected, thus making it possible to prevent an amplitude fluctuation in the output of the third amplifier.

THIRD EMBODIMENT

Figure 4:
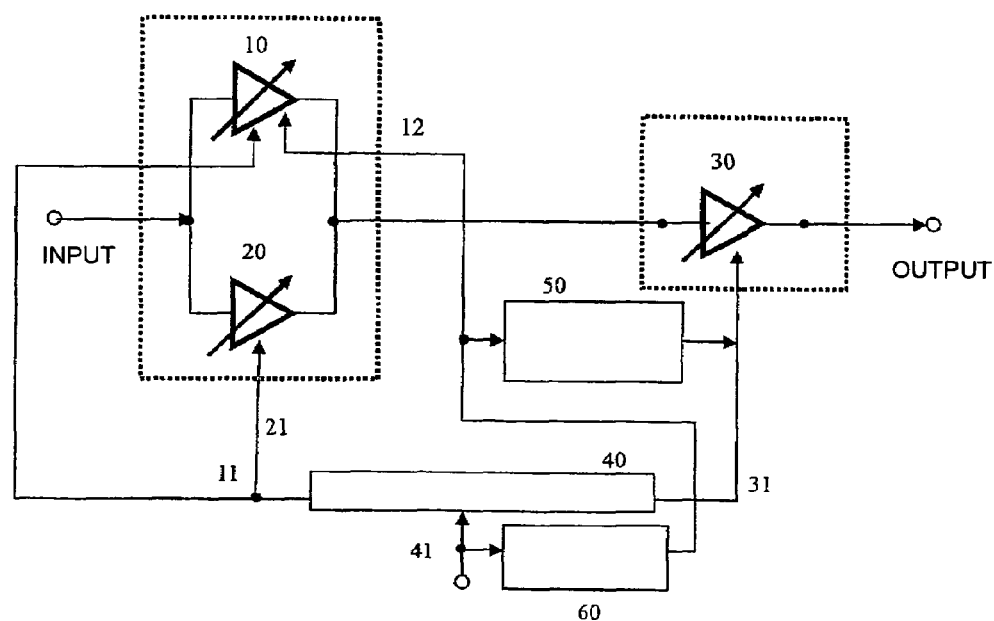
FIG. 4 is a block diagram illustrating a configuration of a variable gain circuit of a third embodiment of the present invention.

A variable gain circuit according to a third embodiment of the present invention is shown in FIG. 4. As shown in FIG. 4, this variable gain circuit is configured such that a gain correction circuit 50 for correcting an amount of gain change caused in conjunction with turning off the output of the first amplifier 10 by the mode switching signal 12 is provided. For that reason, the gain correction circuit 50 has a function to prevent an amplitude fluctuation in the output of the third amplifier 30 by shifting the third gain control signal 31, which is the output of the gain control signal converting circuit 40.

Moreover, in this variable gain circuit, in order to create the mode switching signal 12, there is provided with a detection circuit 60 for detecting a level of the fourth gain control signal 41. This detection circuit 60 outputs a comparison result between a detected signal and a reference signal as the mode switching signal 12.

Figure 5:
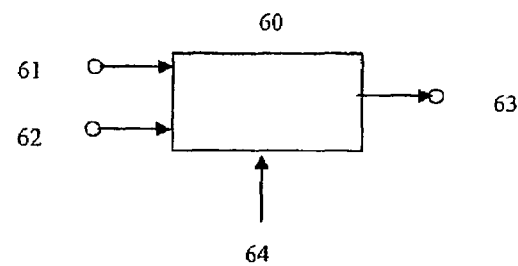
FIG. 5 is a block diagram illustrating a configuration of a detection circuit.

As shown in FIG. 5, the aforementioned detection circuit 60 compares the fourth gain control signal 41 (detected signal 61) and the reference signal 62, and outputs a signal 63 (mode switching signal 12) of the detection result, which is an output thereof, at the timing of a clock signal 64.

The configuration other than the above is similar to that of the second embodiment.

According to this embodiment, the mode switching signal 12 can be automatically created according to the level of the fourth gain control signal 41. Additionally, since the third gain control signal 31 is shifted by the gain correction circuit 50 simultaneously with switching the mode, a sudden change of an output level of the third amplifier 30 in switching the mode can be prevented.

FOURTH EMBODIMENT

Figure 6:
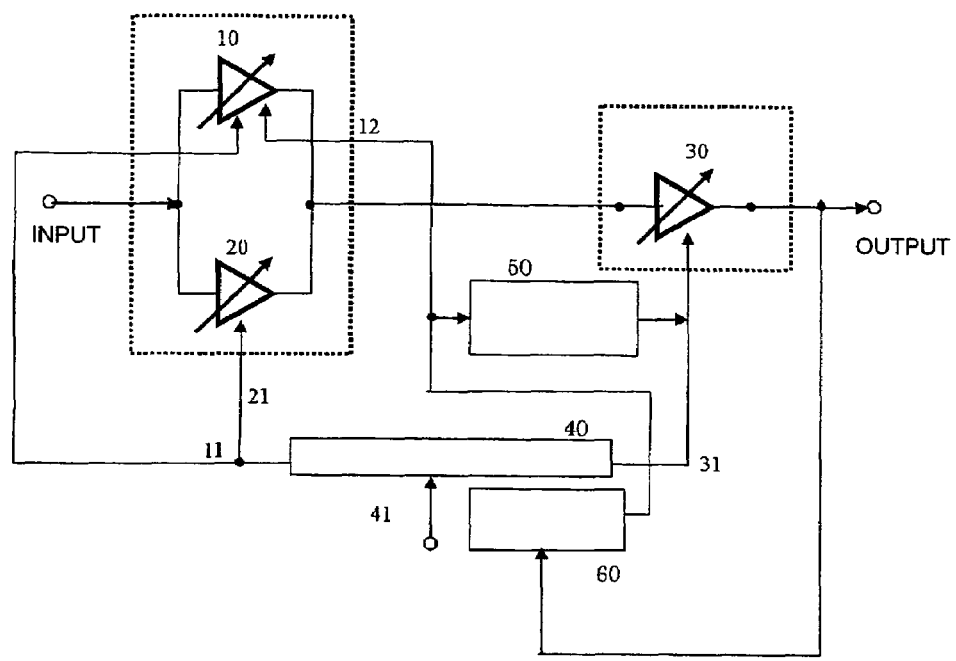
FIG. 6 is a block diagram illustrating a configuration of a variable gain circuit of a fourth embodiment of the present invention.

A variable gain circuit according to a fourth embodiment of the present invention is shown in FIG. 6. As shown in FIG. 6, this variable gain circuit is configured such that the detection circuit 60, instead of detecting the level of the fourth gain control signal 41, detects the output level of the third amplifier 30 when fixing the gains of the first amplifier 10, the second amplifier 20, and the third amplifier 30, by setting the level of the fourth gain control signal 41 constant. The other configuration, and the function and effect are similar to those of the third embodiment.

FIFTH EMBODIMENT

Figure 7:
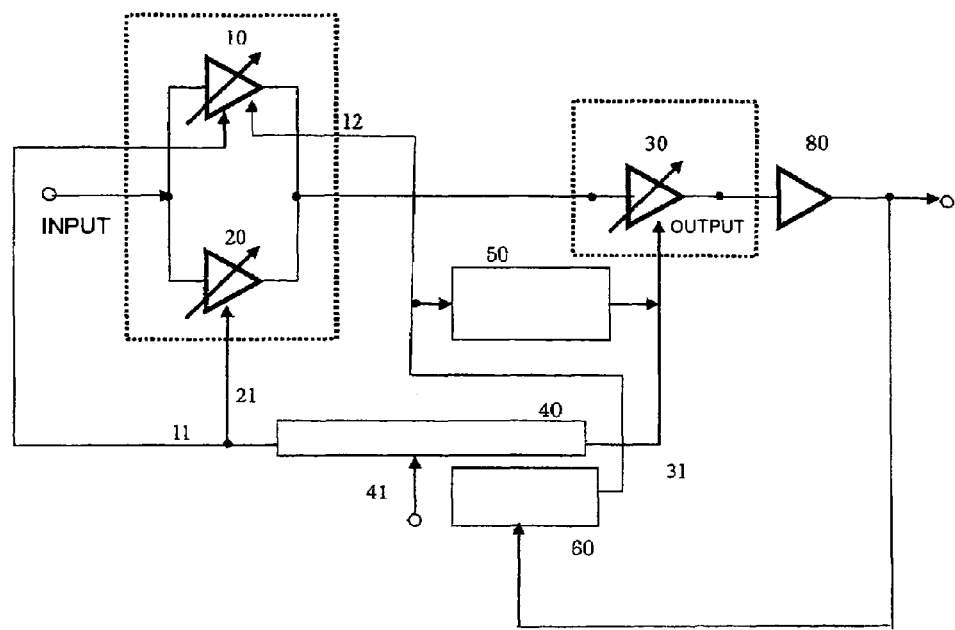
FIG. 7 is a block diagram illustrating a configuration of a variable gain circuit of a fifth embodiment of the present invention.

A variable gain circuit according to a fifth embodiment of the present invention is shown in FIG. 7. As shown in FIG. 7, this variable gain circuit has such a configuration that a fourth amplifier 80 is further provided in a subsequent stage of the third amplifier 30. The detection circuit 60, instead of detecting the level of the fourth gain control signal 41, then detects an output level of the fourth amplifier 80. Also in this embodiment, in a manner similar to that of the fourth embodiment, the output level of the fourth amplifier 80 is detected in a state of keeping the output level of the fourth gain control signal 41 constant. The other configuration, and the function and effect are similar to those of the third embodiment.

SIXTH EMBODIMENT

Figure 8:
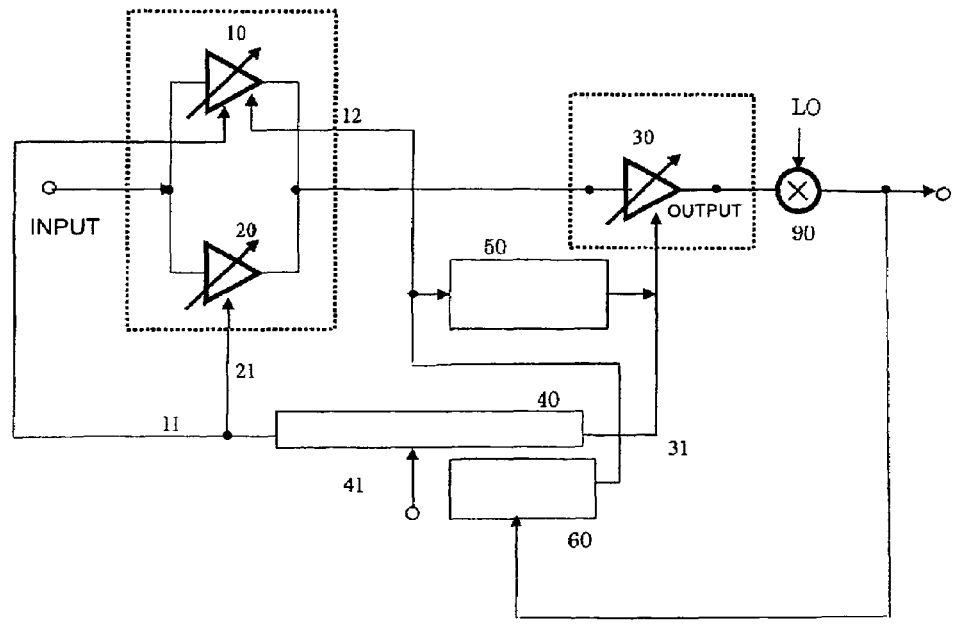
FIG. 8 is a block diagram illustrating a configuration of a variable gain circuit of a sixth embodiment of the present invention.

A variable gain circuit according to a sixth embodiment of the present invention is shown in FIG. 8. As shown in FIG. 8, this variable gain circuit has such a configuration that a mixer circuit 90 is provided in a subsequent stage of the third amplifier 30. The mixer circuit 90 receives the output signal of the third amplifier 30 and a local oscillation signal LO. The detection circuit 60, instead of detecting the level of the fourth gain control signal 41, then detects an output level of the mixer circuit 90. Also in this embodiment, in a manner similar to that of the fourth embodiment, the output level of the mixer circuit 90 is detected in a state of keeping the output level of the fourth gain control signal 41 constant. The other configuration, and the function and effect are similar to those of the third embodiment.

SEVENTH EMBODIMENT

Figure 9:
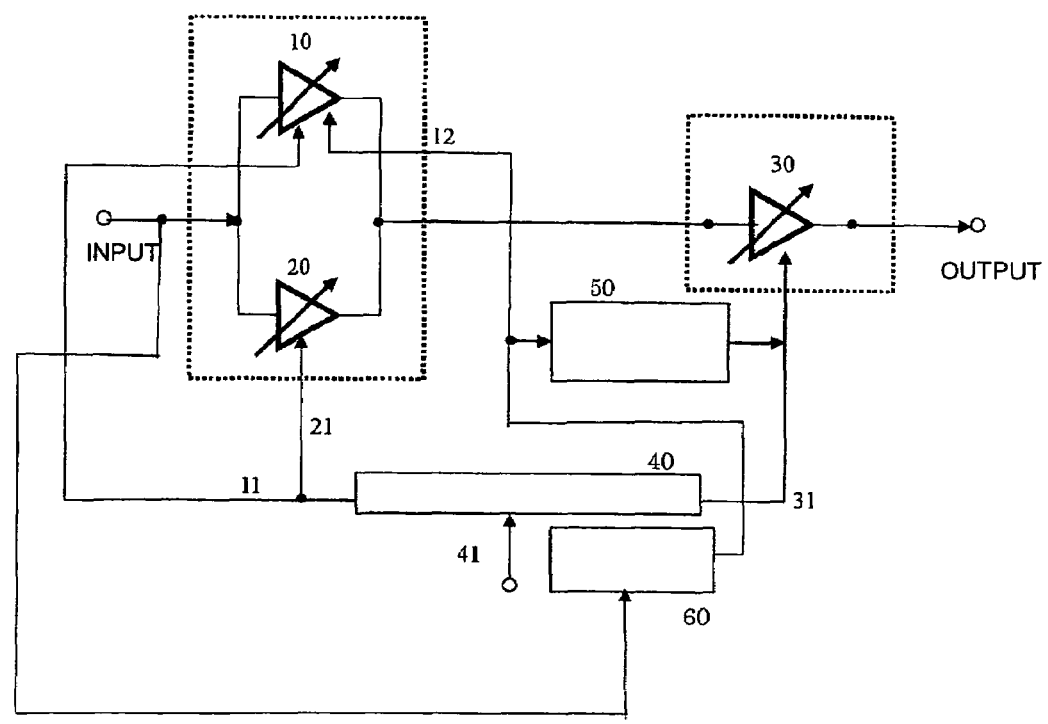
FIG. 9 is a block diagram illustrating a configuration of a variable gain circuit of a seventh embodiment of the present invention.

A variable gain circuit according to a seventh embodiment of the present invention is shown in FIG. 9. As shown in FIG. 9, this variable gain circuit is configured such that the detection circuit 60, instead of detecting the level of the fourth gain control signal 41, detects an input level of the first and the second amplifiers 10 and 20. The other configuration, and the function and effect are similar to those of the third embodiment.

EIGHTH EMBODIMENT

Figure 10:
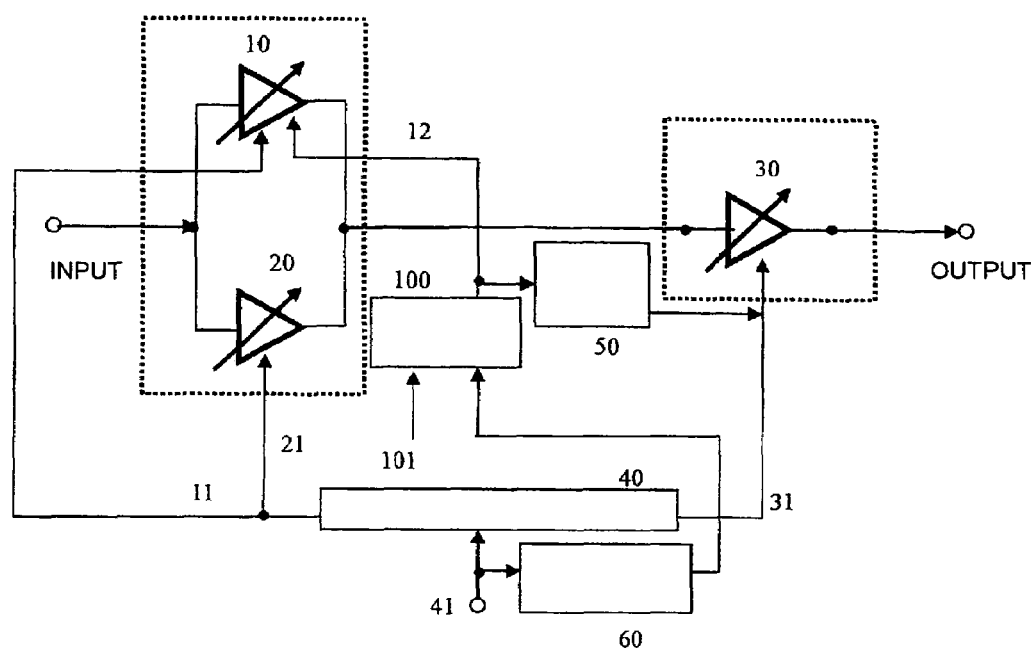
FIG. 10 is a block diagram illustrating a configuration of a variable gain circuit of an eighth embodiment of the present invention.

A variable gain circuit according to an eighth embodiment of the present invention is shown in FIG. 10. As shown in FIG. 10, this variable gain circuit is configured such that a mode switching status circuit 100 is added to the configuration shown in FIG. 4, and the other configuration is similar to the embodiment shown in FIG. 4. The mode switching status circuit 100 receives a switching enabling signal 101, and implements switching between an active state of allowing the ON/OFF switching operation for the first amplifier 10 and the control for the gain correction circuit 50 in conjunction with it, and a sleep state of prohibiting them.

According to this embodiment, an ON/OFF control of the output of the first amplifier 10 according to the level of the input signal can be invalidated. Consequently, it becomes possible to also perform the operation similar to that of the prior art.

Moreover, when the ON/OFF of the first amplifier 10 is switched during data transmission, the data can not be correctly received at that moment, so that a baseband LSI can control so as to turn off a varying function during the data transmission. Thereby, the data can be correctly received. The other effect is similar to that of the third embodiment.

NINTH EMBODIMENT

Figure 11:
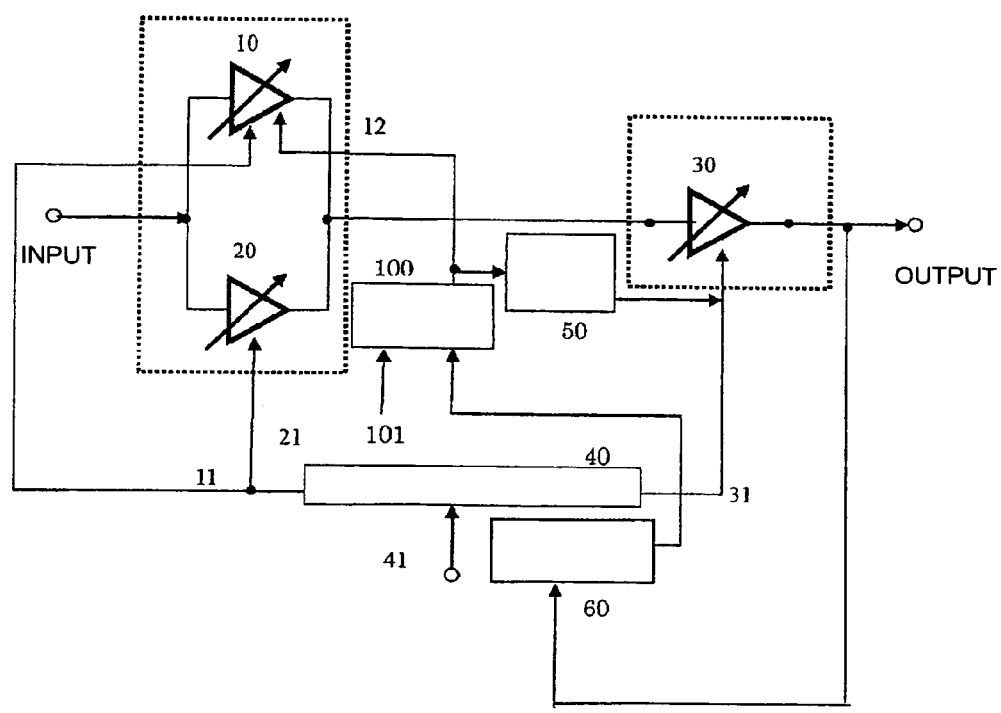
FIG. 11 is a block diagram illustrating a configuration of a variable gain circuit of a ninth embodiment of the present invention.

A variable gain circuit according to a ninth embodiment of the present invention is shown in FIG. 11. As shown in FIG. 11, this variable gain circuit is configured such that the detection circuit 60, instead of detecting the level of the fourth gain control signal 41, detects the output level of the third amplifier 30 when fixing the gains of the first amplifier 10, the second amplifier 20, and the third amplifier 30, by setting the level of the fourth gain control signal 41 constant. Also in this embodiment, in a manner similar to that of the fourth embodiment, the output level of the fourth amplifier 80 is detected in a state of keeping the output level of the fourth gain control signal 41 constant. The other configuration, and the function and effect are similar to those of the eighth embodiment.

TENTH EMBODIMENT

Figure 12:
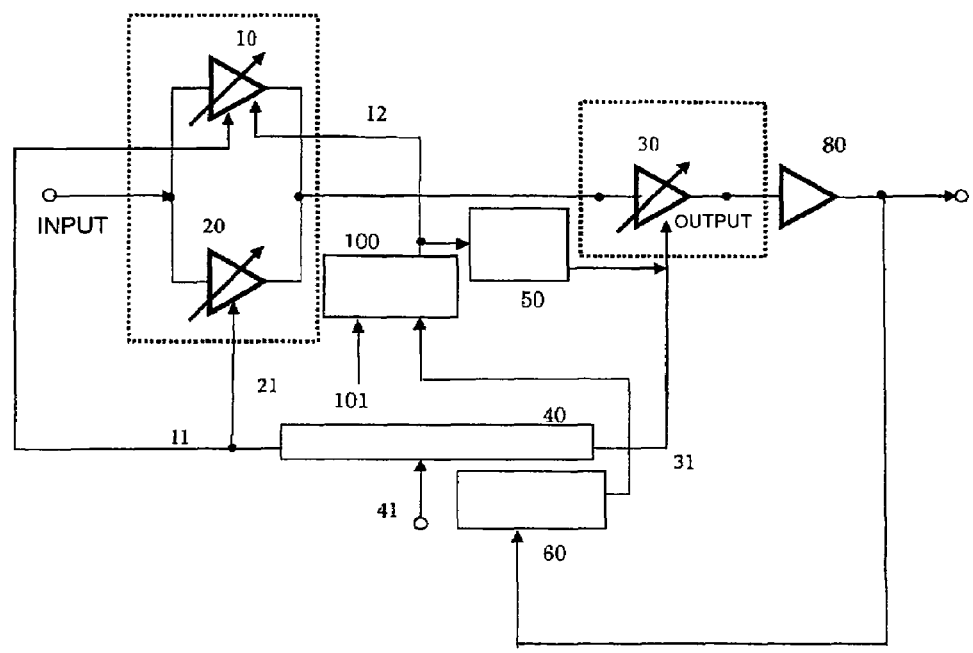
FIG. 12 is a block diagram illustrating a configuration of a variable gain circuit of a tenth embodiment of the present invention.

A variable gain circuit according to a tenth embodiment of the present invention is shown in FIG. 12. As shown in FIG. 12, this variable gain circuit has such a configuration that the fourth amplifier 80 is further provided in the subsequent stage of the third amplifier 30. The detection circuit 60, instead of detecting the level of the fourth gain control signal 41, then detects the output level of the fourth amplifier 80. The other configuration, and the function and effect are similar to those of the eighth embodiment.

ELEVENTH EMBODIMENT

Figure 13:
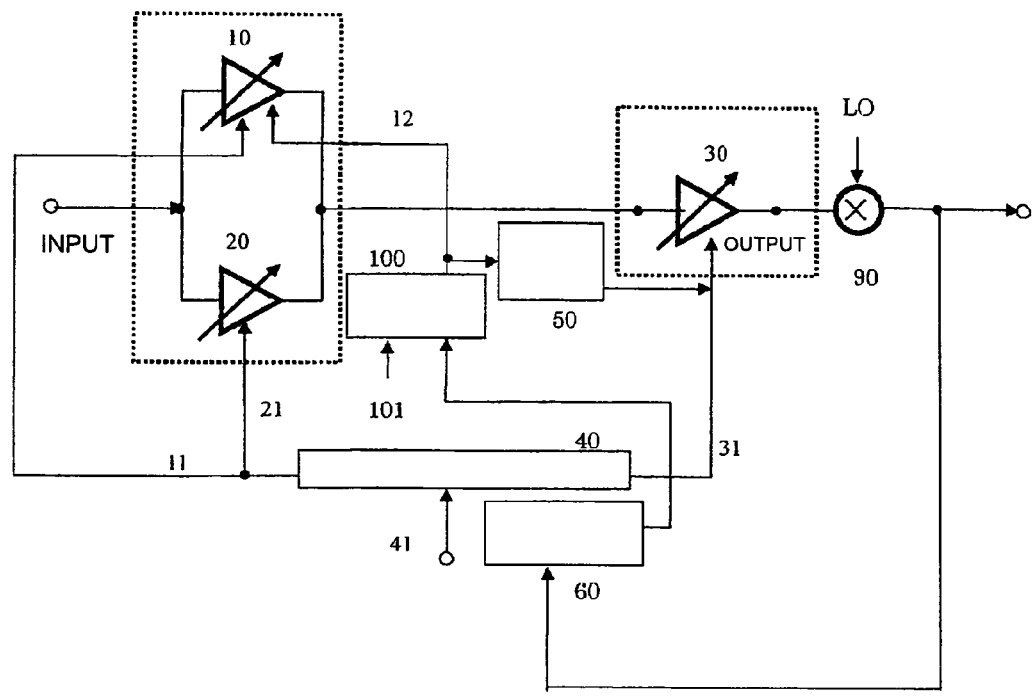
FIG. 13 is a block diagram illustrating a configuration of a variable gain circuit of an eleventh embodiment of the present invention.

A variable gain circuit according to an eleventh embodiment of the present invention is shown in FIG. 13. As shown in FIG. 13, this variable gain circuit has such a configuration that the mixer circuit 90 is provided in the subsequent stage of the third amplifier 30. The detection circuit 60, instead of detecting the level of the fourth gain control signal 41, then detects the output level of the mixer circuit 90. Also in this embodiment, in a manner similar to that of the fourth embodiment, the output level of the mixer circuit 90 is detected in a state of keeping the output level of the fourth gain control signal 41 constant. The other configuration, and the function and effect are similar to those of the eighth embodiment.

TWELFTH EMBODIMENT

Figure 14:
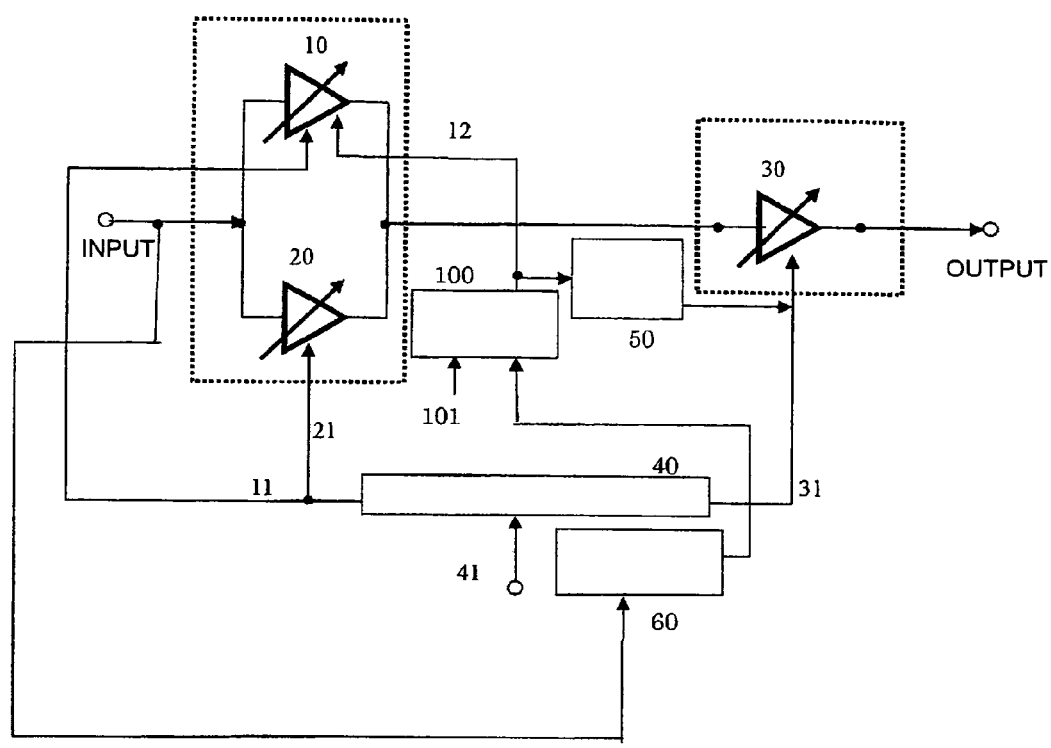
FIG. 14 is a block diagram illustrating a configuration of a variable gain circuit of a twelfth embodiment of the present invention.

A variable gain circuit according to a twelfth embodiment of the present invention is shown in FIG. 14. As shown in FIG. 14, this variable gain circuit is configured such that the detection circuit 60, instead of detecting the level of the fourth gain control signal 41, detects an input level of the first and the second amplifiers 10 and 20. The other configuration, and the function and effect are similar to those of the eighth embodiment.

THIRTEENTH EMBODIMENT

Figure 15:
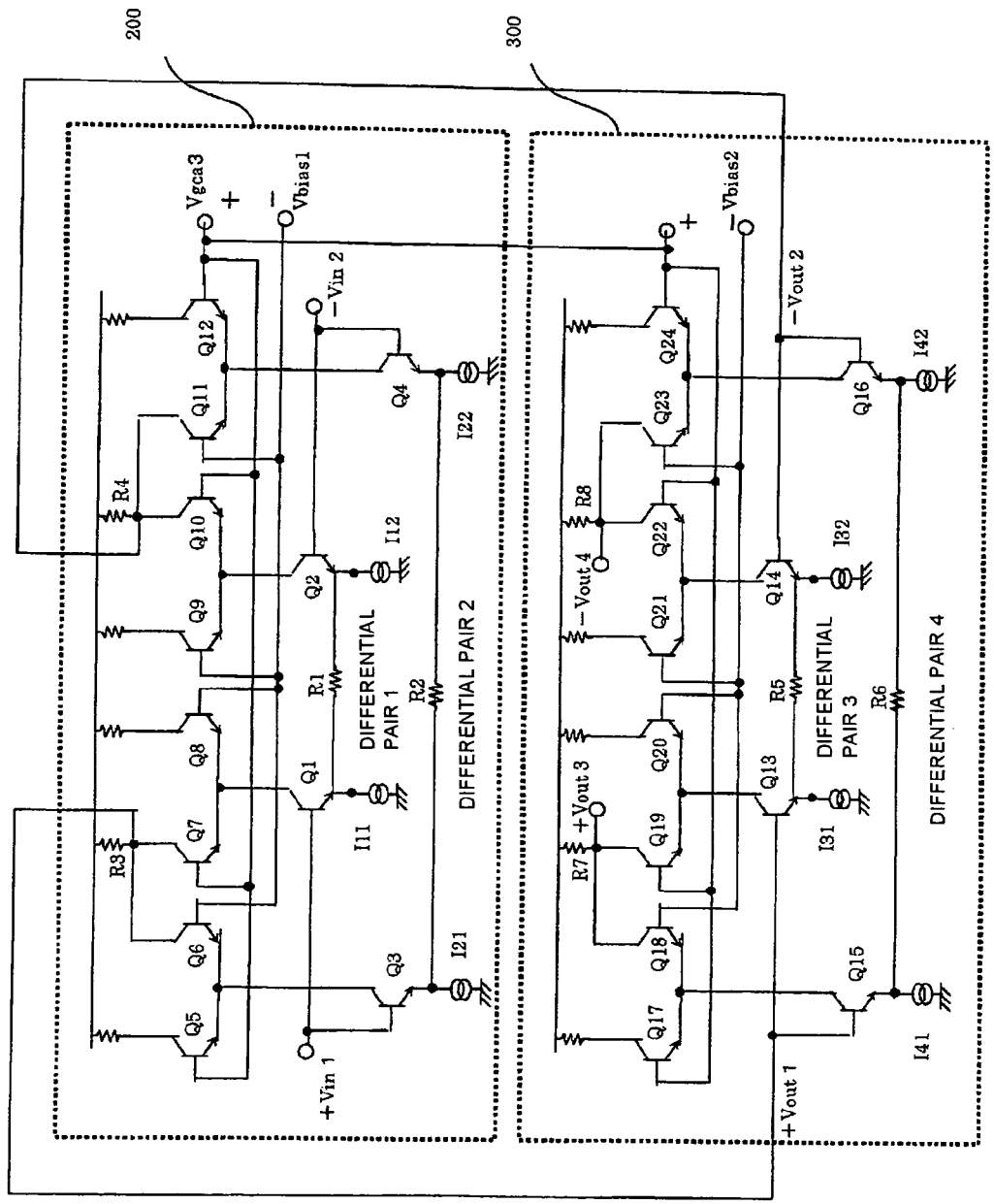
FIG. 15 is a circuit diagram illustrating a configuration of a variable gain circuit of a thirteenth embodiment of the present invention.

A variable gain circuit according to a thirteenth embodiment of the present invention is shown in FIG. 15. This embodiment specifically represents a configuration of a part of the first, the second, and the third amplifiers in the embodiment shown in FIG. 2.

Namely, as shown in FIG. 15, this variable gain circuit has such a configuration that two variable gain circuits the same as that used in FIG. 25 are employed, and those two variable gain circuits are cascade-connected while the circuit thereof is partially changed. The preceding stage will be described as a variable gain circuit section 200, and the subsequent stage side will be described as a variable gain circuit section 300.

Hereafter, description will be made more specifically. The variable gain circuit section 200 at the preceding stage converts output currents Iout1 and Iout2 of the variable gain circuit used in FIG. 25 into output voltages Vout1 and Vout2 through resistors R3 and R4. Moreover, a positive electrode of a gain control voltage Vgca1 and a negative electrode of a gain control voltage Vgca2 are coupled to provide a gain control voltage Vgca3 thereto. Further, a negative electrode of the gain control voltage Vgca1 and a positive electrode of the gain control voltage Vgca2 are coupled to provide a bias voltage Vbias1 thereto. According to this configuration, gain control voltages of the first and the second amplifiers 10 and 20 are in common use.

The variable gain circuit section 300 at the subsequent stage has a configuration similar to that of the variable gain circuit section 200, and is composed of a differential pair 3 including an amplifier with high gain and low noise, and a differential pair 4 composing an amplifier with low gain and low distortion. In FIG. 15, symbols Q13 through Q24 represent transistors, respectively. Symbols R5 through R8 represent resistors, respectively. Reference numerals 131, 132, 141, and 142 represent current sources, respectively.

In this variable gain circuit section 300, the gain control voltage Vgca3 is supplied in common with the variable gain circuit section 200. Meanwhile, a bias voltage Vbias2 is supplied independently from the variable gain circuit section 200. Output voltages of the variable gain circuit section 300 are given as Vout3 and Vout4.

An input of the variable gain circuit section 300 is then coupled with an output of the variable gain circuit section 200, so that the two variable gain circuit sections 200 and 300 are cascade-connected.

Once the commonality between the gain control voltages of the variable gain circuit section 200 is achieved as described above, a change in gain of the variable gain circuit section 200 is obtained, when a gain of the differential pair 1 that is a high gain and low noise amplifier and a gain of the differential pair 2 that is a low gain and low distortion amplifier are summed, by changing gain contribution factors of both amplifiers.

Similarly, once the commonality between the gain control voltages of the variable gain circuit section 300 is achieved as described above, a change in gain of the variable gain circuit section 300 is obtained, when a gain of the differential pair 3 that is a high gain and low noise amplifier and a gain of the differential pair 4 that is a low gain and low distortion amplifier are summed, by changing gain contribution factors of both amplifiers.

A concrete change in gain will be given by following equations.

$$G=(A*x)+(B*(1-x))$$

if $0 \leq x \leq 1$, then $B \leq G \leq A$
G=total gain of the variable gain circuit
A=gain of the amplifier with high gain and low noise
B=gain of the amplifier with low gain and low distortion
x=gain contribution factor of the amplifier with high gain and low noise
1−x=gain contribution factor of the amplifier with low gain and low distortion Note herein that, for settings of the bias voltage Vbias1 and the bias voltage Vbias2, in order to prevent degradation of a noise figure (Noise Figure), when the input level is changed from a low input level to a high input level, it is set as Vbias2>Vbias1 so that the gain of the variable gain circuit section 200 may be saturated previously. Moreover, in order that ranges where the gains of the variable gain circuit section 200 and the variable gain circuit section 300 change linearly are not overlapped with each other, control ranges (widths) are adjusted with values of the bias voltage Vbias1 and the bias voltage Vbias2.

Figure 16:
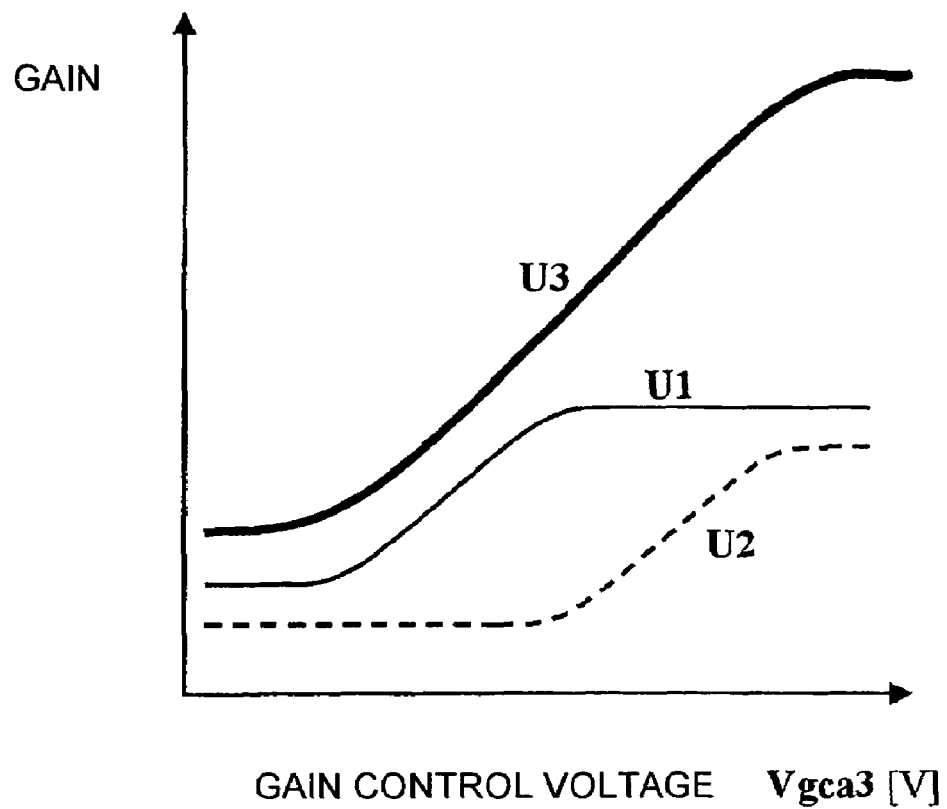
FIG. 16 is a characteristic graph illustrating a gain to a gain control voltage of a variable gain circuit in which variable gain circuit sections are cascade-connected in two stages.

Respective gain curves of the variable gain circuit section 200 and the variable gain circuit section 300, and the total gain curve thereof are shown in FIG. 16. In FIG. 16, a thin solid line U1 represents a change in gain of the variable gain circuit section 200 with respect to a change in gain control voltage. A broken line U2 represents a change in gain of the variable gain circuit section 300 with respect to a change in gain control voltage. A thick solid line U3 represents a change in total gain of the variable gain circuit sections 200 and 300 with respect to a change in gain control voltage.

As can be seen from FIG. 16, when the gain control voltage Vgca3 is the minimum voltage, the gains of the variable gain circuit section 200 and the variable gain circuit section 300 are the minimum gain. When the gain control voltage Vgca3 is increased, the gain of the variable gain circuit section 200 will be increased first. Subsequently, when the gain of the variable gain circuit section 200 almost reaches its maximum, the gain of the variable gain circuit section 300 will begin to increase. Next, when the gain control voltage Vgca3 is the maximum voltage, the gains of the variable gain circuit section 200 and the variable gain circuit section 300 becomes the maximum gain.

At the high input level that results in a problem, the gain of the variable gain circuit section 300 is the minimum gain, and the gain of the variable gain circuit section 200 is on decreasing, so that collector currents of transistors Q7 and Q10 are not completely turned off. For that reason, an influence of distortion appears in the output of the variable gain circuit. When it becomes higher input level, since the transistors Q7 and Q10 are thoroughly turned off, the influence of distortion becomes small.

Figure 17:
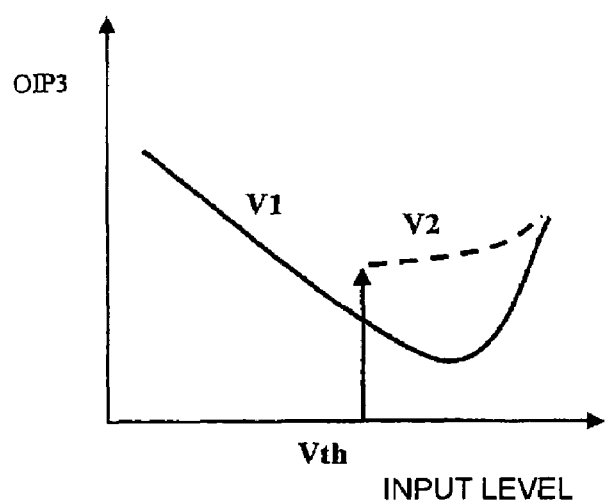
FIG. 17 is a graph illustrating a third order output intercept point OIP3 to an input level when a differential pair 1 is ON, and OFF.

There is shown in FIG. 17 a third order output intercept point OIP3 with respect to the input level when the gain control voltage Vgca3 is changed so that the output of the variable gain circuit may become constant. In FIG. 17, a solid line V1 represents a state when the differential pair 1 is not turned off. A broken line V2 represents a state when the differential pair 1 is turned off and a gain correction is performed (this will be hereinbelow described).

Figure 18:
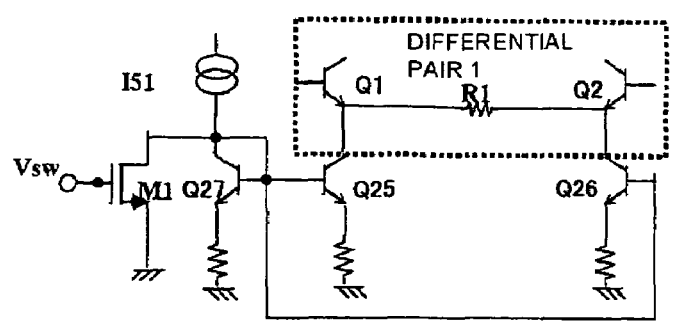
FIG. 18 is a circuit diagram illustrating a specific example of a gain control circuit.

In order to turn off thoroughly the collector currents of the transistors Q7 and Q10, it is required to turn off current sources 111 and 112 of the differential pair 1. As an example of the method, it is considered to compose an actual circuit of the current source of the differential pair 1 shown in FIG. 15 in such a way shown in FIG. 18.

As can be seen from the drawing, an emitter of a transistor Q1 is coupled with a collector of a transistor Q25 serving as the current source 111, and an emitter of a transistor Q2 is coupled with a transistor Q26 serving as the current source 112. Additionally, bases of the transistor Q25 and the transistor Q26 are coupled with a base of a transistor Q27. The bases of the transistors Q25, Q26, and Q27, which are in common use, are coupled with a collector of the transistor Q27. Further, the collector of the transistor Q27 is coupled with a current source 151. Thereby, a current of the current source 151 that is coupled with the collector of the transistor Q27 is mirrored to the transistors Q25 and Q26. Moreover, a drain of a MOS transistor M1 is coupled with the collector of the transistor Q27, and a mode switching signal Vsw is inputted into a gate of the transistor M1.

When the mode switching signal Vsw is in a low level, the transistor M1 turns off and the differential pair 1 turns on.

Meanwhile, when the mode switching signal Vsw is in a high level, the transistor M1 turns on and the differential pair 1 turns off. Hence, inputting a low level signal or a high level signal as the mode switching signal Vsw into the transistor M1 makes it possible to turn on or off the differential pair 1.

Figure 19:
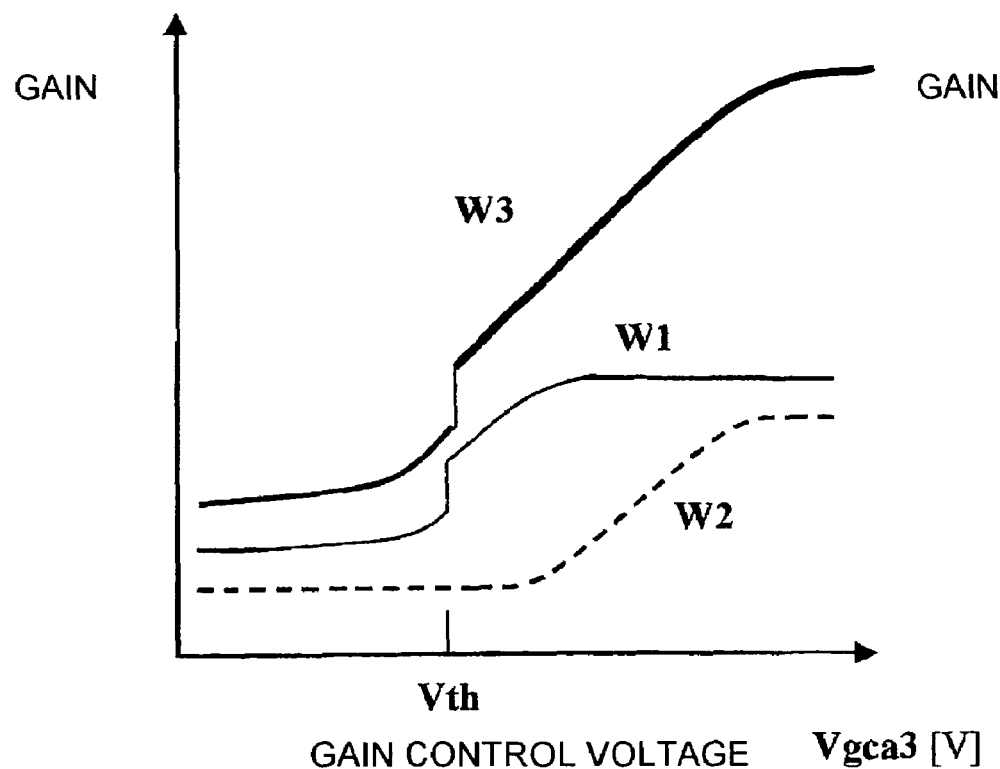
FIG. 19 is a characteristic graph illustrating a gain to a gain control voltage of a variable gain circuit cascade-connected in two stages, which can turn off a first amplifier of a variable gain circuit section in a preceding stage.

By turning off the differential pair 1, however, the total gain of the variable gain circuit section 200 and the variable gain circuit section 300 with respect to the gain control voltage Vgca3 will not be continuous as shown in FIG. 19. Here, it is assumed that the gain control voltage Vgca3 in switching ON/OFF of the differential pair 1 be a certain arbitrary reference voltage (switching voltage) Vth. In FIG. 19, a thin solid line W1 represents a change in gain of the variable gain circuit section 200 with respect to a change in gain control voltage Vgca3. A broken line W2 represents a change in gain of the variable gain circuit section 300 with respect to the change in gain control voltage Vgca3. A thick solid line W3 represents a change in total gain of the variable gain circuit sections 200 and 300 with respect to the change in gain control voltage Vgca3.

For that reason, the variable gain circuit of the present embodiment is provided with a gain correction circuit for correcting, at the same time when the differential pair 1 of the variable gain circuit section 200 turns off, a gain decrement at that time by increasing the gain of the variable gain circuit section 300. This gain correction circuit corresponds to, for example, the gain correction circuit 50 shown in FIG. 6.

Figure 20:
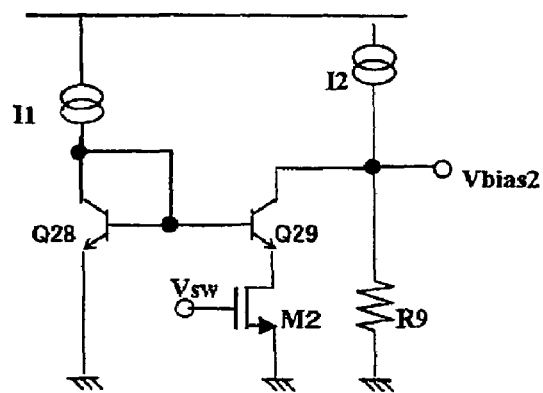
FIG. 20 is a circuit diagram illustrating a specific example of a gain correction circuit.

One example of the gain correction circuit is shown in FIG. 20. In this gain correction circuit, the mode switching signal Vsw used for turning off the differential pair 1 is employed, and the bias voltage Vbias2 supplied to the variable gain circuit section 300 is thereby changed, at the same time when the differential pair 1 of the variable gain circuit section 200 turns off.

More specifically, a source of a MOS transistor M2 is coupled with a ground, and a drain thereof is coupled with an emitter of a transistor Q29, where the mode switching signal Vsw is inputted into a gate thereof. Moreover, a base of the transistor Q29 and a base of a transistor Q28 are coupled with each other, and the coupled bases of both transistors Q28 and Q29 and a collector of the transistor Q28 are coupled. Further, a current source I1 is coupled with the collector of the transistor Q28. Thereby, a current of the current source I1 coupled with the collector of the transistor Q28 is mirrored to the transistor Q29. A collector of the transistor Q29 is coupled with a node between a current source I2 and a resistor R9. However, it is assumed that I1<I2.

In the above configuration, when the mode switching signal Vsw is in a high level, the transistor M2 turns on. For that reason, a mirror current I1 flows through the collector of the transistor Q29, and a current obtained by subtracting a current of the current source I1 from the current of the current source I2 flows through the resistor R9.

Meanwhile, when the mode switching signal Vsw is in a low level, the transistor M2 turns off. For that reason, a current does not flow through the transistor Q29, but the current of the current source I2 flows through the resistor R9 as it is.

As a result, the bias voltage Vbias2 when the mode switching signal Vsw is in a low level becomes smaller than that when it is in a high level.

According to the above configuration and operation, the gain correction circuit reduces the bias voltage Vbias2, at the same time when the mode switching signal Vsw becomes a high level, and the differential pair 1 turns off.

As described above, the bias voltage Vbias2 is reduced by the gain correction circuit, and a gain control range (width) of the variable gain circuit section 300 with respect to the gain control voltage is shifted toward a small gain control voltage, there by making it possible to increase the gain of the variable gain circuit section 300 in the gain control voltage (reference voltage Vth) when turning off the differential pair 1.

Figure 21:
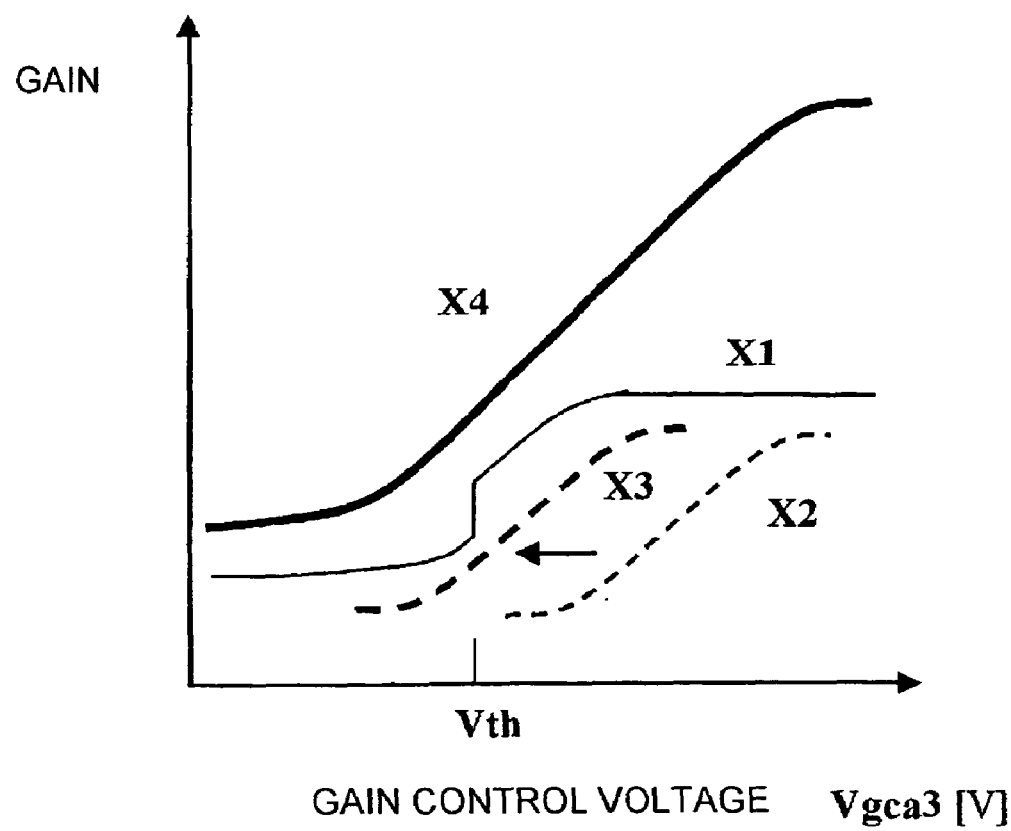
FIG. 21 is a characteristic graph illustrating a gain to a gain control voltage of a variable gain circuit cascade-connected in two stages to which a gain correction circuit is added.

As a result of this, as shown in FIG. 21, the total gain of the variable gain circuit sections 200 and 300 can obtain a continuous and equal change to the gain control voltage Vgca3 irrespective of the ON/OFF of the differential pair 1. In FIG. 21, a thin solid line X1 represents the change in gain of the variable gain circuit section 200 with respect to the change in gain control voltage Vgca3. A thin broken line X2 represents the change in gain of the variable gain circuit section 300 with respect to the change in gain control voltage Vgca3. A thick broken line X3 represents a state where the gain control range (width) of the variable gain circuit section 300 is shifted in a direction indicated by an arrowhead. A thick solid line W4 represents the change in total gain of the variable gain circuit sections 200 and 300 with respect to the change in gain control voltage Vgca3.

Moreover, the third order intercept point 1 OIP3 with respect to the input level when the differential pair is ON and OFF is shown in FIG. 17. The above is one example of the variable gain circuit according to the present invention, which reduces the distortion to the high input level and smoothly changes the gain.

FOURTEENTH EMBODIMENT

Figure 22:
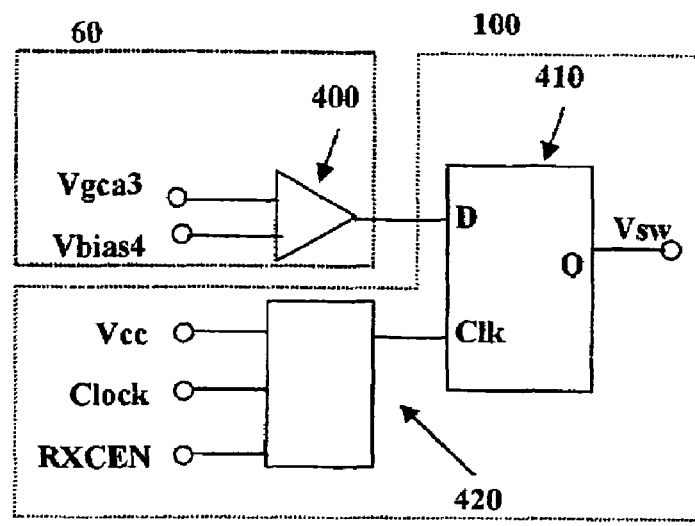
FIG. 22 is a block diagram illustrating a specific example of the detection circuit.

A variable gain circuit according to a fourteenth embodiment of the present invention is shown in FIG. 22. This embodiment specifically represents a configuration of the detection circuit 60 and the mode switching status circuit 100. Since the signals that the detection circuit 60 detects are different for every embodiment, but the circuit configuration of the detection circuit 60 itself is the same, the case where the gain control voltage Vgca3 is used as the detected signal will be described herein as one example.

As shown in FIG. 22, the detection circuit 60 is comprising a logic circuit 400, and the mode switching status circuit 100 is comprising a flip-flop circuit 410 and a logic circuit 420.

The logic circuit 400 will output a low level as the mode switching signal Vsw, when the gain control voltage Vgca3 exceeds a certain arbitrary reference voltages Vth, and will output a high level as the mode switching signal Vsw when it is below the reference voltage Vth. The reference voltage Vth is a bias voltage Vbias4 here. Incidentally, an illustration of a clock signal is omitted.

The flip-flop circuit 410 receives an output of the logic circuit 400 as a data input. An output of the logic circuit 420 is employed for a clock input of the flip-flop circuit 410.

The logic circuit 420 receives an output clock of a temperature compensated crystal oscillator as a clock (Clock), receives a supply voltage Vcc as a DC signal, and further receives a switching enabling signal RXCEN for allowing a clock output. This logic circuit 420 then outputs the clock (Clock) when the switching enabling signal RXCEN is in a high level, and outputs the DC signal of the supply voltage Vcc when it is in a low level.

A method of detecting the gain control voltage Vgca3 is as follows. That is, when the switching enabling signal RXCEN is brought to a high level, the clock outputted from the logic circuit 420 turns into the clock Clk of the flip-flop circuit 410. For that reason, a state of the gain control voltage Vgca3 can be detected via the logic circuit 400 at the timing of a clock period, and thus, the level of the mode switching signal Vsw will be determined to either of a high level and a low level. Meanwhile, when the switching enabling signal RXCEN is a in low level, since the DC signal of the voltage Vcc is outputted from the logic circuit 420, the output of the flip-flop 410 will be fixed. For that reason, the mode switching signal Vsw at the moment when the switching enabling signal RXCEN is brought to a low level is also fixed to a high level or low level state.

Hence, an active state for allowing the control of the gain correction circuit can be realized by bringing the switching enabling signal RXCEN to a high level. In addition, a sleep state for prohibiting the control of the gain correction circuit can be realized by bringing the switching enabling signal RXCEN to a low level.

Note herein that, in the aforementioned embodiment, what controls the gain of the variable gain circuit section 300 by the gain correction circuit has been described. However, it is not limited to this, and in a preceding stage of the variable gain circuit section 200, namely, in a preceding stage of the input of the differential pair 1 and the differential pair 2, an amplifier or an attenuator that has a gain variable (or switching) function may be provided. In this case, the function to correct the amount of the gain change resulting from turning off the differential pair 1 by controlling the gain of the variable gain circuit section 300 using the gain correction circuit may be used or may not be used.

Hereafter, this point will be described in detail. When the function to correct the amount of the gain change resulting from turning off the first amplifier 10 by controlling the gain of the variable gain circuit section 300 is not employed, an attenuator or an amplifier at a preceding stage is operated as follows.

In other words, the attenuator at the preceding stage is operated, or the gain of the amplifier at the preceding stage is reduced at the input level when the output of the variable gain circuit section 200 begins to be distorted (level that turns off the first amplifier 10), or more. The input level of the variable gain circuit section 200 is thereby reduced. Consequently, the low distortion and the low gain can be realized in a high input level. The detection circuit 60 is used for a high input level judgment, and the mode switching signal Vsw due to the detection result controls the attenuator or the amplifier. Since it is not necessary to correct the gain of the variable gain circuit section 300, the effect results in that the dynamic range can be expanded without the need of the gain correction circuit.

Meanwhile, when the function to correct the amount of the gain change resulting from turning off the first amplifier 10 by controlling the gain of the variable gain circuit section 300 using the gain correction circuit is employed, the attenuator or the amplifier at the preceding stage is operated as follows.

That is, the attenuator or the amplifier may be operated, at the same time when the mode is switched, but it is preferably operated when the total gain of the variable gain circuit section 200 and the variable gain circuit section 300 becomes the minimum gain. When operating them simultaneously, the detection circuit 60 and the mode switching status circuit 100 can be used in common. Meanwhile, when not operating them simultaneously, a plurality of detection circuits having different reference signals, and a plurality of mode switching status circuits may be prepared. Since the high input level is expanded by the gain decrement according to the attenuator or the amplifier, the effect results in that a wider dynamic range can be obtained.

Moreover, while respective aforementioned embodiments have been described regarding the variable gain circuit, a communication module can be composed using the variable gain circuits of these embodiments. Similarly, a telecommunication apparatus can be composed using the variable gain circuits of these embodiments. Further, a mobile terminal can be composed using the variable gain circuits of these embodiments. Moreover, a mobile communication system can also be composed of the aforementioned mobile terminal, and the other mobile terminals connected with this mobile terminal.

INDUSTRIAL APPLICABILITY

The variable gain circuit in accordance with the present invention has a wide dynamic range, and provides a low noise performance when the gain is high and a low distortion performance when the gain is low, so that it is useful as a circuit for use in a wireless communication apparatus or the like including a communication module or a personal digital assistant.

What is claimed is:

1. A variable gain circuit, comprising:
a first amplifier with high gain having a first amplifier input and a first amplifier output, and being gain-controlled by a first gain control signal; and
a second amplifier with low gain having a second amplifier input and a second amplifier output, and being gain-controlled by a second gain control signal,
wherein direction of a gain change of the first amplifier with respect to a change of the first gain control signal, and direction of a gain change of the second amplifier with respect to a change of the second gain control signal are set in reverse to each other, and the first gain control signal and the second gain control signal are in common use,
wherein an input signal is supplied in common to the first and the second amplifiers by coupling the first amplifier input and the second amplifier input with each other, and the output signal of the first amplifier and the output signal of the second amplifier are additionally combined by coupling the first amplifier output and the second amplifier output with each other, and
wherein the first amplifier has a function to turn on and off an output in response to a mode switching signal.

2. The variable gain circuit according to claim 1, wherein the first amplifier is comprising a first fixed gain amplifier of voltage input current output type, and a first shunt circuit for shunting an output current of the first fixed gain amplifier to two current output terminals at a shunt ratio according to the first gain control signal, and the second amplifier is comprising a second fixed gain amplifier of voltage input current output type, and a second shunt circuit for shunting an output current of the second fixed gain amplifier to two current output terminals at a shunt ratio according to the second gain control signal,
wherein an input terminal of the first fixed gain amplifier and an input terminal of the second fixed gain amplifier form the first amplifier input and the second amplifier input, respectively, and either of the current output terminals of the first shunt circuit and either of the current output terminals of the second shunt circuit form the first amplifier output and the second amplifier output, respectively.

3. The variable gain circuit according to claim 1, wherein the first amplifier input and the second amplifier input are differential inputs, respectively.

4. The variable gain circuit according to claim 3, wherein the first amplifier output and the second amplifier output are differential outputs, respectively.

5. A variable gain circuit, comprising:
a first amplifier with high gain having a first amplifier input and a first amplifier output, and being gain-controlled by a first gain control signal;
a second amplifier with low gain having a second amplifier input and a second amplifier output, and being gain-controlled by a second gain control signal; and
a third amplifier having a third amplifier input and a third amplifier output, and being gain-controlled by a third gain control signal,
wherein an input signal is supplied in common to the first and the second amplifiers by coupling the first amplifier input and the second amplifier input with each other, and the output signal of the first amplifier and the output signal of the second amplifier are additionally combined by coupling the first amplifier output and the second amplifier output with each other, wherein the third amplifier input is coupled with the first amplifier output and the second amplifier output, and the first amplifier has a function to turn on and off an output in response to a mode switching signal.

6. The variable gain circuit according to claim 5, comprising a gain correction circuit for correcting an amount of gain change resulting from the output of the first amplifier being cut off, by changing a gain of the third amplifier using the third gain control signal, at the same time when the output of the first amplifier is cut off, wherein an amplitude fluctuation in the output of the third amplifier is prevented by the gain correction circuit.

7. A variable gain circuit, comprising:
a first amplifier with high gain having a first amplifier input and a first amplifier output, and being gain-controlled by a first gain control signal;
a second amplifier with low gain having a second amplifier input and a second amplifier output, and being gain-controlled by a second gain control signal; and
a gain control signal converting circuit for creating the first gain control signal and the second gain control signal from a fourth gain control signal,
wherein an input signal is supplied in common to the first and the second amplifiers by coupling the first amplifier input and the second amplifier input with each other, and the output signal of the first amplifier and the output signal of the second amplifier are additionally combined by coupling the first amplifier output and the second amplifier output with each other, and
wherein the first amplifier has a function to turn on and off an output in response to a mode switching signal.

8. The variable gain circuit according to claim 5, comprising a gain control signal converting circuit for creating the first gain control signal, the second gain control signal, and the third gain control signal from the fourth gain control signal.

9. The variable gain circuit according to claim 8, comprising a gain correction circuit for correcting, in conjunction with the output of the first amplifier being cut off by the mode switching signal, an amount of gain change resulting from the output of the first amplifier being cut off, by shifting the third gain control signal, wherein an amplitude fluctuation in the output of the third amplifier is prevented by the gain correction circuit.

10. The variable gain circuit according to claim 9, comprising a detection circuit for outputting the mode switching signal by comparing the fourth gain control signal with a reference signal.

11. The variable gain circuit according to claim 9, comprising a detection circuit for outputting the mode switching signal by comparing an output amplitude of the third gain control signal with a reference signal.

12. The variable gain circuit according to claim 9, wherein at a subsequent stage of the output of the third amplifier, an amplifier or a mixer circuit is connected, and the variable gain circuit comprises a detection circuit for outputting the mode switching signal by comparing an amplitude of an output signal of the amplifier or the mixer circuit with a reference signal.

13. The variable gain circuit according to claim 9, comprising a detection circuit for outputting the mode switching signal by comparing an input amplitude of the first amplifier with a reference signal.

14. The variable gain circuit according to claim 10, wherein the detection circuit, using a clock signal for detection of the fourth gain control signal, has a function to perform the detection at every certain timing.

15. The variable gain circuit according to claim 11, wherein the detection circuit, using a clock signal for detection of the output amplitude of the third amplifier, has a function to perform the detection at every certain timing.

16. The variable gain circuit according to claim 12, wherein the detection circuit, using a clock signal for detection of the amplitude of the output signal of the amplifier or the mixer circuit, has a function to perform the detection at every certain timing.

17. The variable gain circuit according to claim 13, wherein the detection circuit, using a clock signal for detection of the input signal of the first amplifier, has a function to perform the detection at every certain timing.

18. The variable gain circuit according to claim 10, comprising a mode switching status circuit for implementing, by a switching enabling signal, an active state of allowing the ON/OFF switching operation for the first amplifier and the control for the gain correction circuit in conjunction with it, and a sleep state of prohibiting the operation.

19. A variable gain circuit, comprising:
a first amplifier with high gain having a first amplifier input and a first amplifier output, and being gain-controlled by a first gain control signal;
a second amplifier with low gain having a second amplifier input and a second amplifier output, and being gain-controlled by a second gain control signal; and
an amplifier or an attenuator having a gain varying function, which is arranged at a preceding stage of the inputs of the first amplifier and the second amplifier,
wherein an input signal is supplied in common to the first and the second amplifiers by coupling the first amplifier input and the second amplifier input with each other, and the output signal of the first amplifier and the output signal of the second amplifier are additionally combined by coupling the first amplifier output and the second amplifier output with each other, and
wherein the first amplifier has a function to turn on and off an output in response to a mode switching signal.

20. The variable gain circuit according to claim 19, wherein the amplifier or the attenuator having the gain varying function changes a gain simultaneously with generation of the mode switching signal.

* * * * *